United States Patent [19]

Crumly

[11] Patent Number: 5,069,628
[45] Date of Patent: Dec. 3, 1991

[54] FLEXIBLE ELECTRICAL CABLE CONNECTOR WITH DOUBLE SIDED DOTS

[75] Inventor: William R. Crumly, Anaheim, Calif.

[73] Assignee: Hughes Aircraft Company, Los Angeles, Calif.

[21] Appl. No.: 492,141

[22] Filed: Mar. 13, 1990

[51] Int. Cl.⁵ .............................................. H01R 9/09
[52] U.S. Cl. ........................................ 439/67; 29/830; 29/847; 29/852; 439/77; 439/908
[58] Field of Search .................. 439/67, 77, 492, 684, 439/722, 908; 29/830, 847, 852, 853, 876

[56] References Cited

U.S. PATENT DOCUMENTS

| | | | |
|---|---|---|---|
| 3,753,816 | 8/1973 | Feldstein et al. | 29/847 |
| 4,075,757 | 2/1978 | Malm et al. | 29/847 |
| 4,125,310 | 11/1978 | Reardon, II et al. | 339/92 M |
| 4,184,729 | 1/1980 | Parko et al. | 439/67 |
| 4,453,795 | 6/1984 | Moulin | 339/92 M |
| 4,889,584 | 2/1989 | Wada et al. | 29/852 |
| 4,897,918 | 2/1990 | Osaka et al. | 29/830 |
| 4,899,439 | 2/1990 | Potter | 29/830 |

FOREIGN PATENT DOCUMENTS 0154591  6/1989  Japan ..................... 29/847

*Primary Examiner*—Paula A. Bradley
*Attorney, Agent, or Firm*—Terje Gudmestad; Wanda K. Denson-Low

[57] ABSTRACT

Electrically conductive traces (50) are formed on a surface (40a) of a flexible cable (40). Electrically conductive dots (62) are formed on the exposed surfaces (50b) of the traces (50) to facilitate connection of the traces (50) to a mating connector. Substantially rigid dots (68) are formed over the opposite sides (50a) of the traces (50), through or on the opposite surface (40b) of the cable (40), in alignment with the conductive dots (62). This locally increases the thickness of the cable (40) in the area of the dots (62), and minimizes the effects of plastic creep of the flexible material in the cable (40) which could cause poor electrical contact between the conductive dots (62) and traces on the mating connector.

26 Claims, 9 Drawing Sheets

FLEXIBLE ELECTRICAL CABLE CONNECTOR WITH DOUBLE SIDED DOTS

BACKGROUND OF THE INVENTION

1. Field of the Invention

The present invention generally relates to flexible electrical connectors, and more specifically to a flexible cable carrying electrically conductive traces with dots formed thereon to facilitate connection of the traces to a mating connector.

2. Description of the Related Art

Flexible cables carry electrically conductive traces for interconnection of electrical circuit boards and components. Electrically conductive dots or buttons may be formed on end portions of the traces for mating with conjugate traces on another connector formed on, for example, a circuit board. An example of this type of arrangement is found in U.S. Pat. No. 4,453,795, entitled "CABLE-TO-CABLE/COMPONENT ELECTRICAL PRESSURE WAFER CONNECTOR ASSEMBLY", issued June 12, 1984, to Norbert Moulin.

Pressure is applied to mate the cable to the conjugate connector such that the buttons on the cable are pressed against the traces on the mating connector to effect electrical contact therebetween. However, the cable is conventionally formed of at least one flexible material which is subject to plastic deformation, such as an adhesive which exhibits creep in response to applied pressure. Even if a resilient pad is used to press the connectors together with a relatively even pressure distribution, the material of the cable under the dots deforms plastically, and the dots progressively recede into the cable.

As shown in FIG. 1 of the drawing, a prior art electrical connector assembly 10 is generally designated as 10. A flexible cable 12 of the assembly 10 includes a base layer 14 formed of a flexible material such as polyimide, and electrically conductive traces 16 adhered to the base layer 14 by an adhesive layer 18 made of, for example, an acrylic adhesive. A coverlay 20 including a polyimide layer 22 and adhesive layer 24 is formed over the surface of the cable 12 and traces 16.

The cable 12 further includes electrically conductive dots or buttons 26 formed on selected traces 16, which are ohmically connected to the respective traces 16 and extend through the coverlay 20 beyond or external of the surface thereof. In other words, the dots 26 protrude beyond the surface of the coverlay 20 by a desired height.

Further illustrated is a connector member such as the edge of a circuit board 28, with which the cable 12 is designed to mate, which carries electrically conductive traces 30 conjugate to the dots 26. The facing surfaces of the cable 12 and circuit board 28 are pressed together such that the dots 26 ohmically contact the traces 30. Pressure is applied by a pressure plate 32 including a rigid back 34 and a resilient pad 36. The dots 26 may be somewhat deformed by the applied pressure to enhance the ohmic connection with the traces 30, whereas the pad 36 serves to make the applied pressure as uniform as possible over the area of the cable 12.

The problem with the prior arrangement of FIG. 1 is illustrated in FIG. 2. The pressure applied to the cable 12 in the area under the dots 26 is necessarily greater than over the main area of the cable 12, due to the protrusion of the dots 26 beyond the surface of the coverlay 20. This results in localized plastic deformation of the adhesive layer 18 and possibly the polyimide layer 14 under the dots 26, and recession of the dots 26 into the cable 12. The height of the dots 26 above the surface of the cable 12 decreases, resulting in reduced pressure between the dots 26 and mating traces 30 on the circuit board 28, and deteriorating electrical contact therebetween.

Plating the dots to a greater height in an attempt to relieve this problem is difficult in practical application. The inner walls of the holes and the exposed surfaces of the traces at the bottom of the holes must be chemically cleaned prior to plating to remove organic materials and oxides. Increasing the plating height of the dots increases the aspect ratio (height/diameter) of the holes, making it increasingly difficult for the cleaning solutions to completely enter therein. In addition, the higher aspect ratio makes it difficult to plate the dots into the holes, which constitute blind vias, due to the increased risk that entrapped bubbles will form in the holes and prevent complete formation of the dots. An entire flexible connector must be discarded if even one dot is not formed properly, since reworking of such a connector is not possible.

SUMMARY OF THE INVENTION

The present invention provides a method for fabricating an electrical connector assembly with double sided dots, which reduces or eliminates the problems caused by plastic deformation of the flexible cable material. In accordance with the invention, electrically conductive traces are formed on a surface of a flexible cable. Electrically conductive dots are formed on the exposed surfaces of the traces to facilitate connection of the traces to a mating connector. Substantially rigid dots are formed over the opposite sides of the traces, through or on the opposite surface of the cable, in alignment with the conductive dots. This locally increases the thickness of the cable in the area of the dots, and minimizes the effects of plastic creep of the flexible material in the cable which could cause poor electrical contact between the conductive dots and traces on the mating connector.

The dots on the back side of the cable may be flush with the surface thereof, or preferably extend beyond the surface. A coverlay may be formed on either or both sides of the cable, with the dots preferably extending through the coverlay on the back side. The invention may further be practiced by forming a coverlay over the dots on the back side of the cable, or forming the backside dots on the back surface of the cable.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
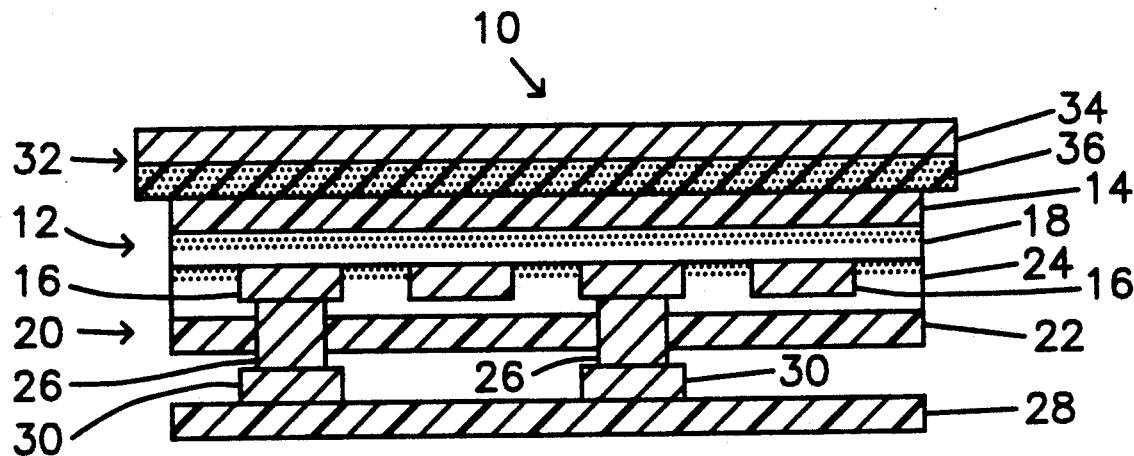
FIGS. 1 and 2 are sectional views of a prior art electrical connector assembly including a flexible cable, illustrating the drawback of the prior art arrangement.
Figure 2:
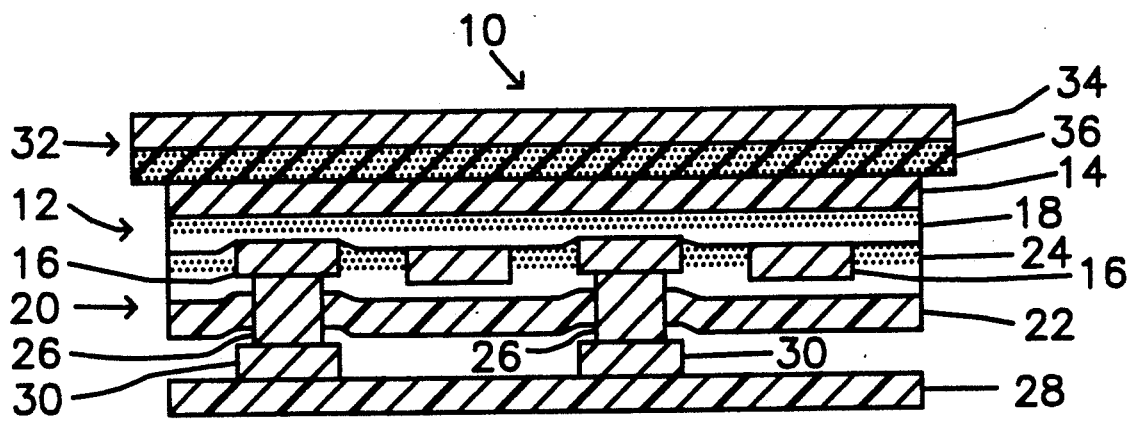
Figure 3A:
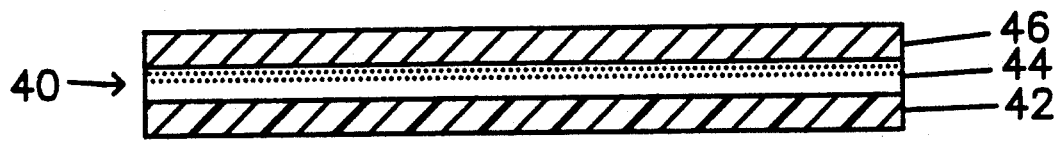
FIGS. 3a to 3k are sectional views illustrating a first method for fabricating an electrical connector assembly embodying the present invention.

This problem described with reference to FIGS. 1 and 2 is overcome by the present invention as illustrated in FIGS. 3a to 3k. The first step of a method of fabricating an electrical connector assembly embodying the present invention is illustrated in FIG. 3a, and includes providing a flexible cable or sheet 40 having a base layer 42 of a flexible material such as polyimide, and an adhesive layer 44 formed of, for example, acrylic adhesive. An electrically conductive layer 46 made of copper or the like is bonded to the base layer 42 by means of the adhesive layer 44.

Figure 3B:
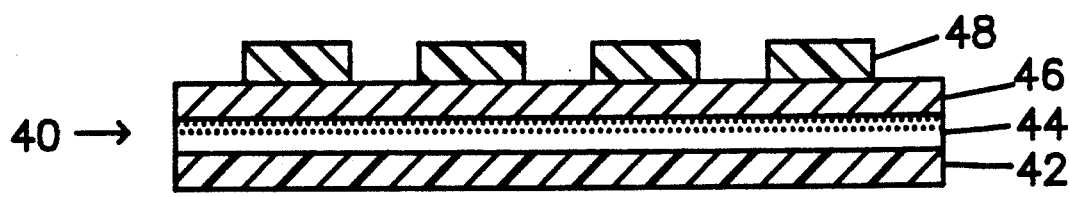

In the next step of FIG. 3b, a resist pattern 48 is formed on the conductive layer 46 by means of, for example, photolithography. The resist pattern 48 is designed to define a predetermined pattern of electrically conductive traces, and is formed of a material such as photoresist which is resistant to a selected etchant solution.

Figure 3C:
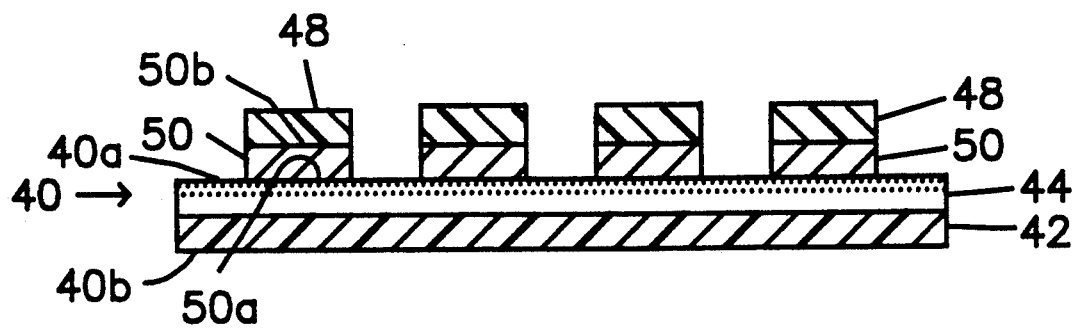

In FIG. 3c, the sheet 40 is exposed to the etchant solution which dissolves away the conductive layer 46 in the areas which are not covered by the resist pattern 48, to leave electrically conductive traces 50 on the adhesive layer 44. The traces 50 are formed on a first or front side 40a of the sheet 40, a second or back side of which is designated as 40b. The traces 50 have first or inner sides 50a which face the first surface 40a of the sheet 40, and second or exposed sides 50b which face away from the sheet 40.

Figure 3D:
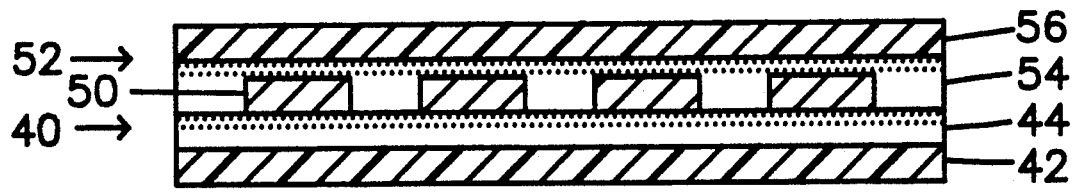

In FIG. 3d, the resist pattern is dissolved or stripped away, and a coverlay 52 including an adhesive layer 54 and polyimide layer 56 is formed over the first surface 40a of the sheet 40 and the traces 50.

Figure 3E:
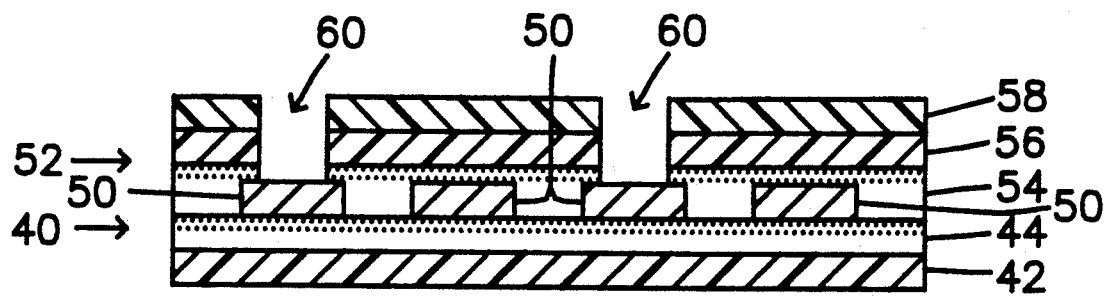

The next step of the process is illustrated in FIG. 3e, and includes forming a sacrificial layer 58 of photoresist or the like on the layer 56. The step of FIG. 3e further includes forming holes 60 through the layers 58, 56, and 54 down to selected traces 50 on which dots are to be formed. The holes 60 may be formed by an excimer laser or any other appropriate means, and are aligned with the intended positions of the dots.

Figure 3F:
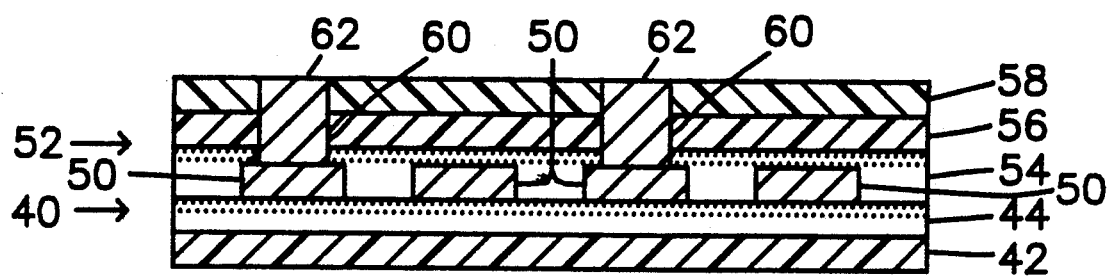
Figure 3G:
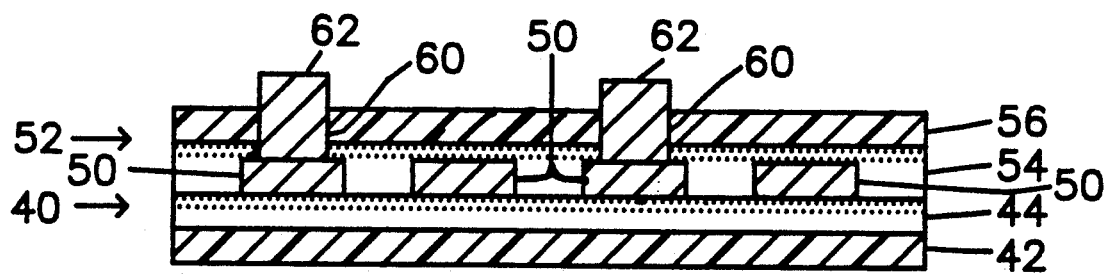

In the step of FIG. 3f, the holes 60 are filled with an electrically conductive material such as gold by an appropriate process, preferably electrical plating. The material in the holes constitutes the desired dots 62. As illustrated in FIG. 3g, when the sacrificial layer 58 is stripped away, the dots 62 protrude beyond the surface of the coverlay 52 for connection with traces on a mating connector (not shown). The steps of FIGS. 3a to 3g produce a cable assembly having single-sided dots as is known in the prior art.

Figure 3H:
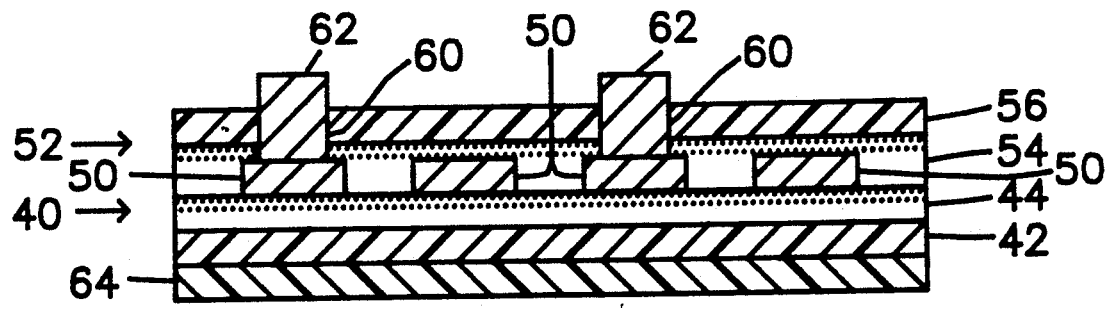

Referring now to FIG. 3h, another sacrificial layer 64 is formed on the second surface 40b of the sheet 40. As viewed in FIG. 3i, the excimer laser or other means is used to form holes 66 through the layers 64, 42, and 44 down to the first sides 50a of the selected traces 50 in alignment with the dots 62. As viewed in FIG. 3j, the plating or other process is used to fill the holes 66 with a rigid material such as gold to form dots or buttons 68 which are carried by the sheet 40. The process is completed as shown in FIG. 3k by stripping away the sacrificial layer 64 to provide an electrical connector assembly 70 embodying the present invention.

The dots 68 are substantially rigid, and extend from the first surface 50a of the traces 50 beyond the second surface 40b of the sheet 40. The dots 68, traces 50, and dots 62 form a continuous metal structure which extends through the entire cross section of the sheet 40 and coverlay 52, and protrudes above the surfaces thereof at its opposite ends. The dots 62 are highly resistant to deformation into the sheet 40 in response to applied pressure, since the underlying adhesive layer 18 and base layer 14 of the prior art assembly 10 shown in FIGS. 1 and 2 have been replaced by rigid metal. This eliminates the problem of deteriorating electrical contact between the dots 62 and conjugate traces on a mating connector due to recession of the dots into the flexible material of the cable.

Figure 3I:
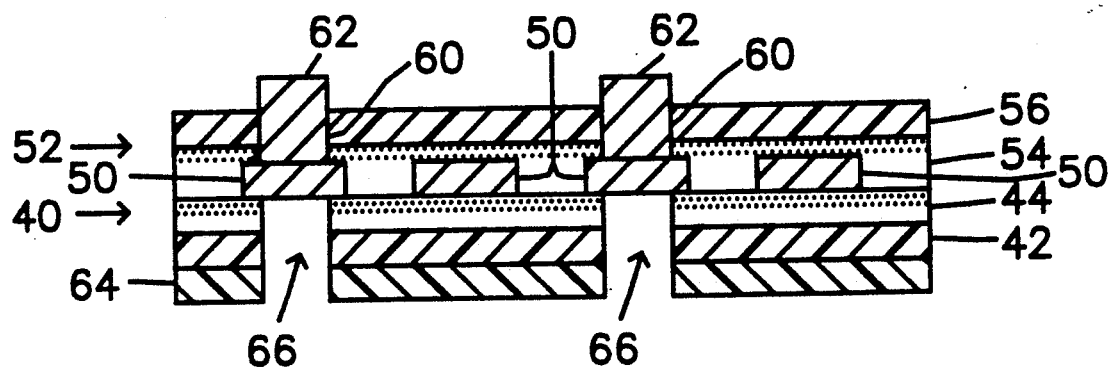
Figure 3J:
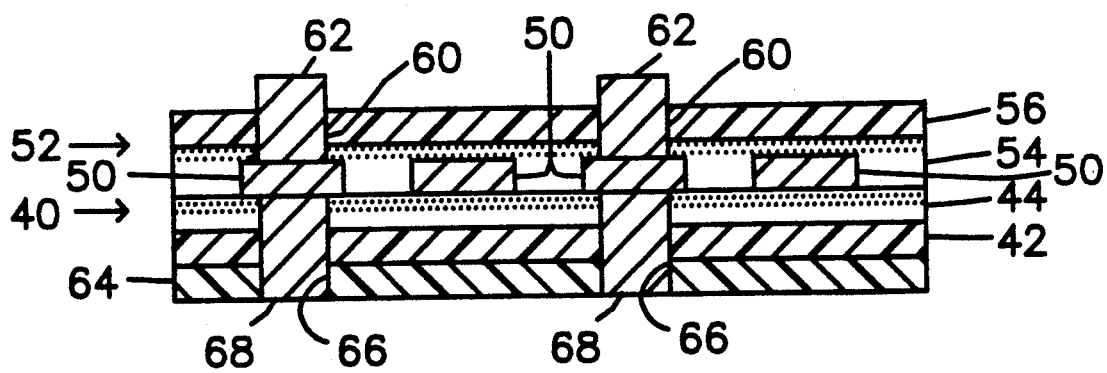
Figure 3K:
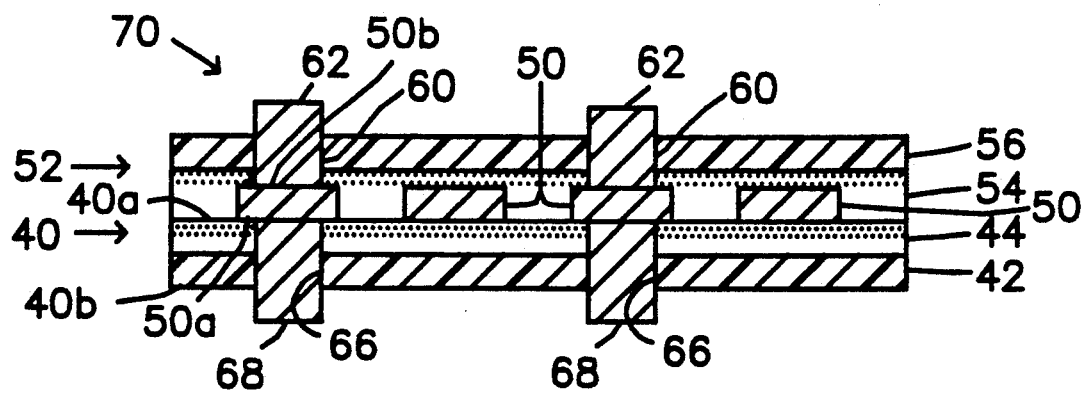
Figure 4A:
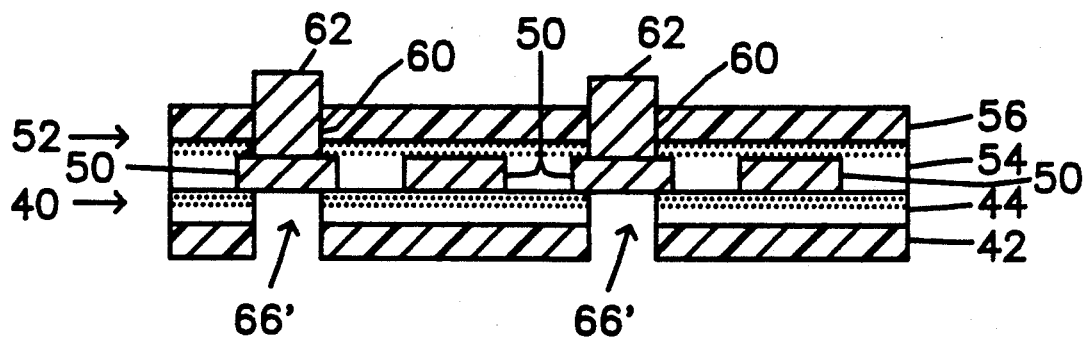
FIGS. 4a and 4b are sectional views illustrating a modification of the method shown in FIGS. 3a to 3k.
Figure 4B:
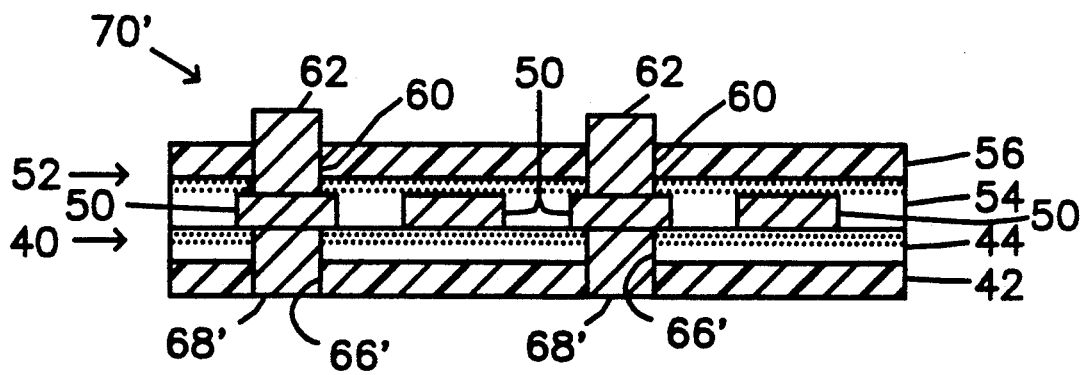

The double sided dot arrangement of FIGS. 3a to 3k provides increased thickness of the cable in the area of the dots, since the dots protrude beyond the surfaces of both sides of the cable. FIGS. 4a and 4b illustrate a modified embodiment of the invention, in which the sacrificial layer 64 used in the steps of FIGS. 3h to 3j is omitted, and holes 66' are formed only through the layers 42 and 44 in the step of FIG. 4a. Dots 68' formed on the back side of the assembly 70' in the step of FIG. 4b extend from the first sides 50a of the traces 50 to the second side 40b of the sheet 40. The dots 68' in FIG. 4b are flush with the surface of the second side 40b of the sheet 40. The assembly 70' of FIGS. 4a and 4b may be fabricated with fewer process steps, but has lower thickness in the area of the dots.

FIGS. 5a to 5h illustrate a second method embodying the present invention which enables the dots on both sides of the cable to be formed simultaneously, using a single plating step. Although the process steps differ from those of FIGS. 3a to 3k, the component elements of the connector assembly fabricated using the method of FIGS. 5a to 5h are essentially similar, and are designated by the same reference numerals used in FIGS. 3a to 3k.

Figure 5A:
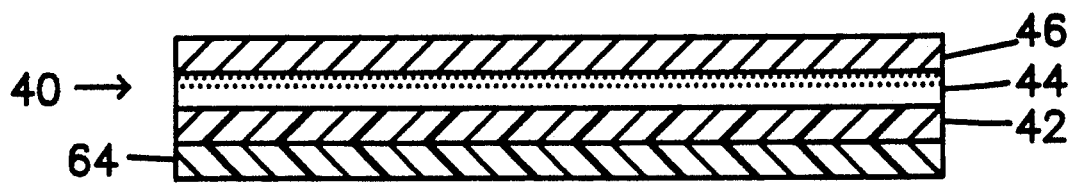
FIGS. 5a to 5h are sectional views illustrating a second fabrication method embodying the invention.
Figure 5B:
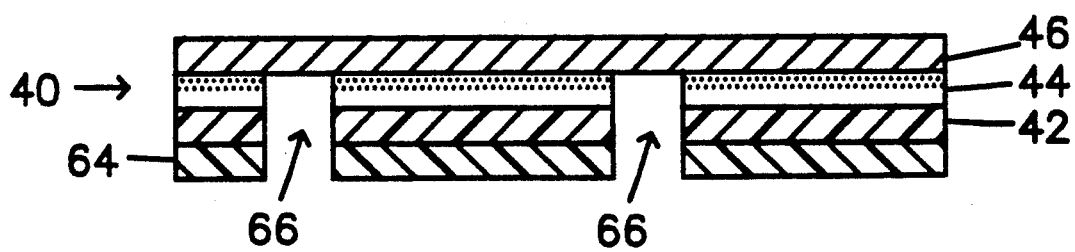

In FIG. 5a, the resist layer 64 is formed on the back side 40b of the sheet 40. In FIG. 5b, the holes 66 are formed through the layers 64, 42, and 44 down to the inner side of the conductive layer 46.

Figure 5C:
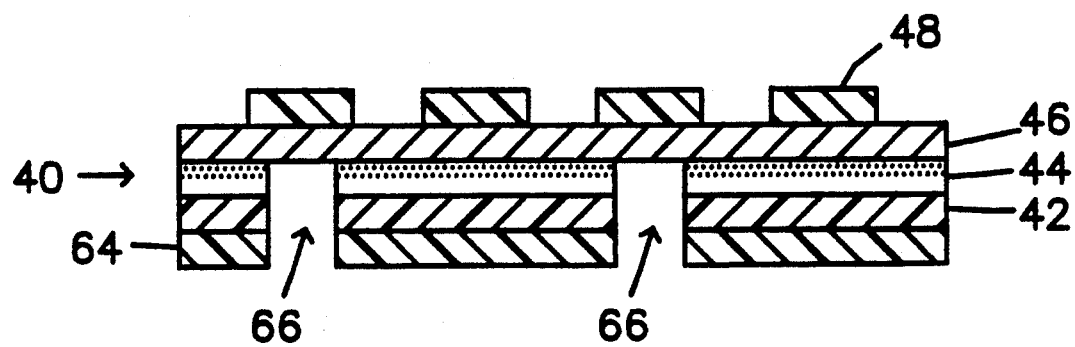
Figure 5D:
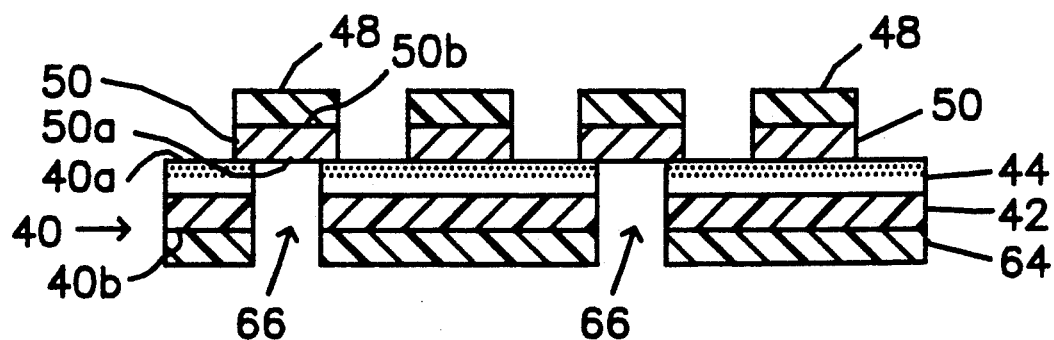
Figure 5E:
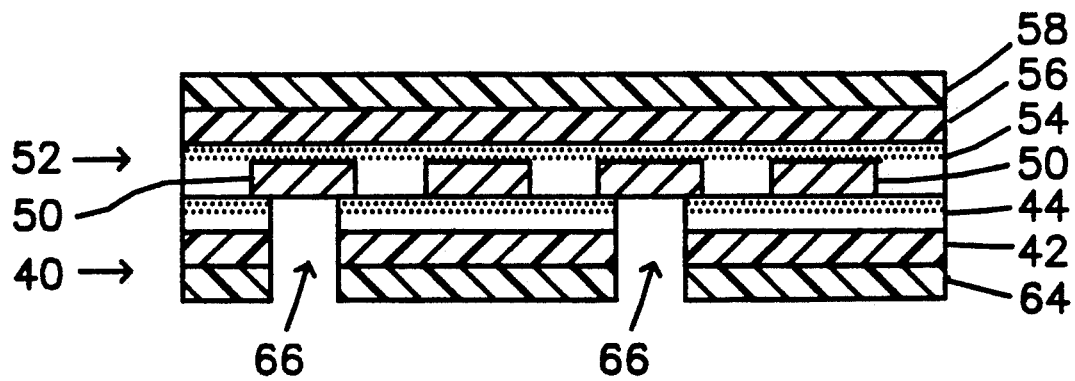
Figure 5F:
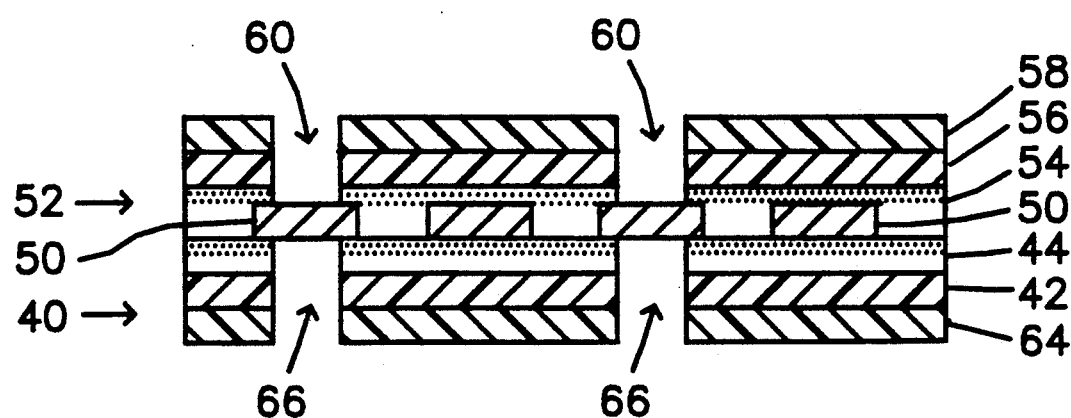

The resist pattern 48 is formed on the conductive layer 46 in FIG. 5c, and the uncovered areas of the conductive layer 46 etched away in FIG. 5d to form the traces 50. The coverlay 52 and sacrificial layer 58 are applied in FIG. 5e. The holes 60 are formed through the layers 58, 56, and 54 in the step of FIG. 5f.

Figure 5G:
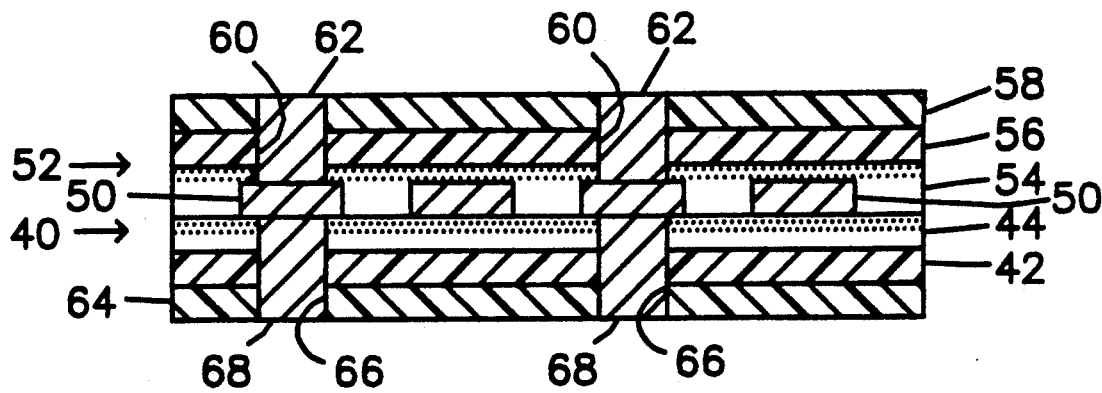
Figure 5H:
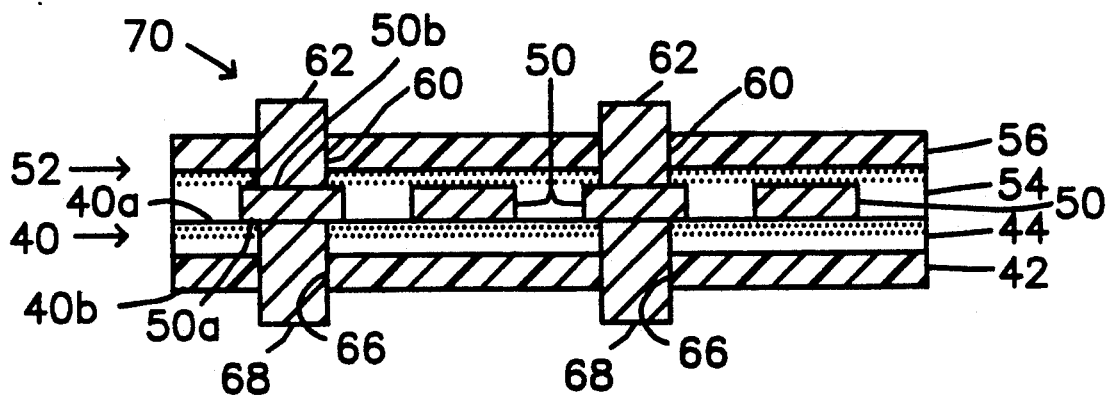

In FIG. 5g, the dots 62 and 68 are formed in the holes 60 and 66 respectively, preferably by simultaneous electrical plating. The process of FIGS. 5a to 5h is advantageous in that all operations relating to the preparation and performance of electrical plating of the assembly need only be done once. Although the holes 66 are illustrated as being formed in the back side of the assembly prior to forming the traces 50, it is within the scope of the invention to form the holes 66 after forming the traces 50, or at any other step in the process prior to plating the dots 62.

Figure 6:
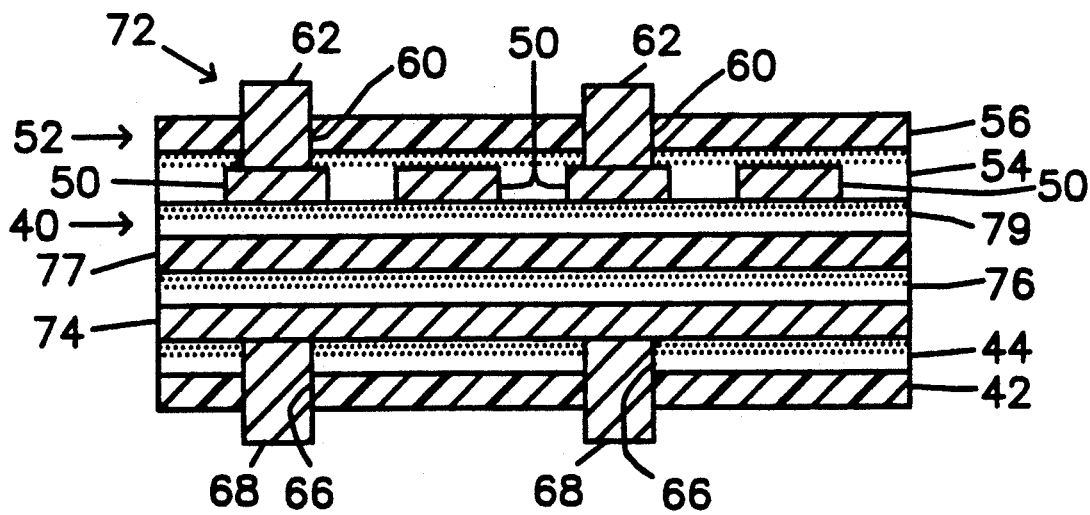
FIGS. 6 to 9 are sectional views illustrating modified embodiments of an electrical connector fabricated in accordance with the present invention.

FIG. 6 illustrates how the invention may be practiced using a double sided flexible cable. In an assembly 72, a conductive layer 74, adhesive layer 76, polyimide layer 77, and adhesive layer 79 are formed on the sheet 40 between the base layer 42 and adhesive layer 44. The conductive layer 74 typically constitutes a ground plane or shield, although it is within the scope of the invention to form the layer 74 into a pattern of traces to provided a double sided connector. The assembly 72 may be fabricated using the method of FIGS. 3a to 3k, or the method of FIGS. 5a to 5h. Although the adhesive layers 76 and 79, which are subject to creep, and the polyimide layer 77, remain between the dots 62 and 68, recession of the dots 62 into the bulk of the assembly 72 is substantially reduced over the prior art. The dots 68 serve to increase the effective height of the dots 62, without increasing the aspect ratio in the plating process as discussed above.

Figure 7:
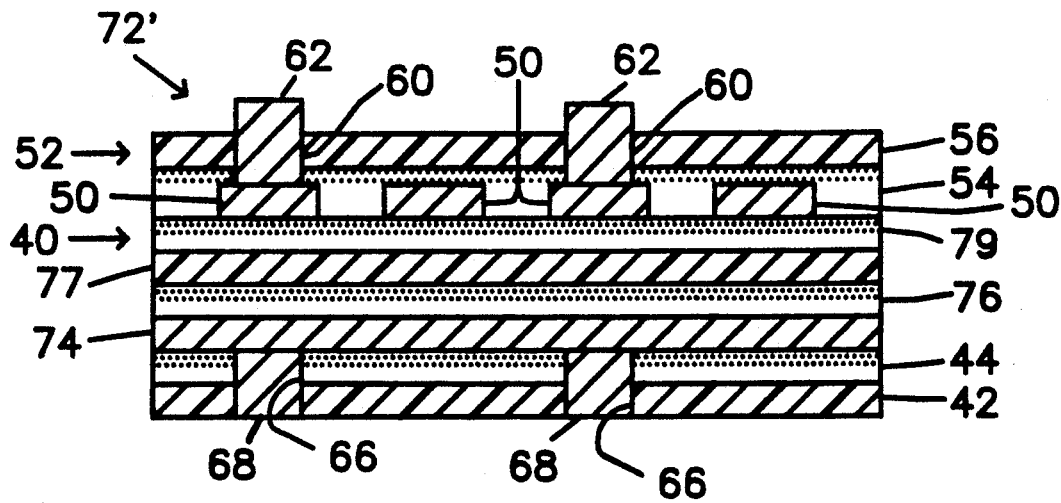

FIG. 7 illustrates an assembly 72' which is similar to the assembly 72 of FIG. 6, except that it is formed using the method of FIGS. 4a and 4b, with the dots 68 flush with the exposed surface of the layer 42.

Figure 8:
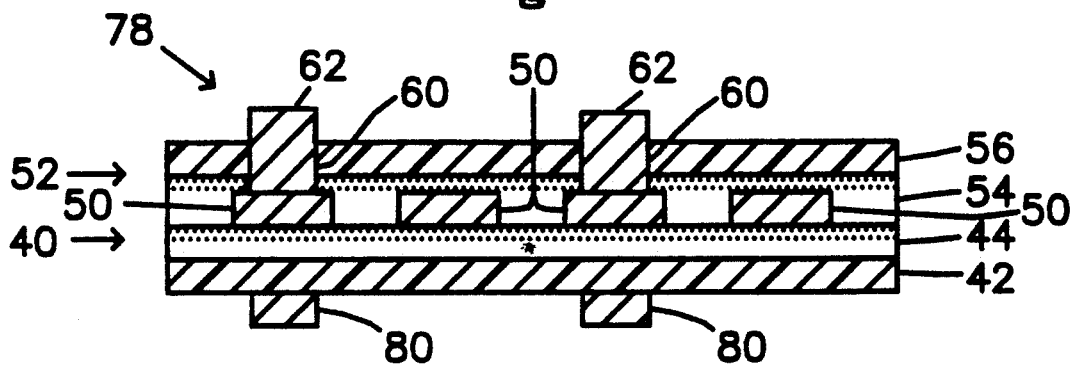

FIG. 8 illustrates another electrical connector assembly 78 embodying the present invention, in which dots or pedestals 80 are formed on the back side 40b of the layer 42 in alignment with the dots 62. The dots 80 may be formed by plating a metallized coverlay on the layer 42, forming a resist pattern on the coverlay, and etching away the coverlay material in the areas not covered by the resist pattern. Although the dots 80 do not extend through the layers 42 and 44 to the traces 50, they do increase the thickness of the assembly 78 in the area of the dots 62, and provide increased resistance to adhesive creep of the flexible material of the cable 40 over the prior art.

Figure 9:
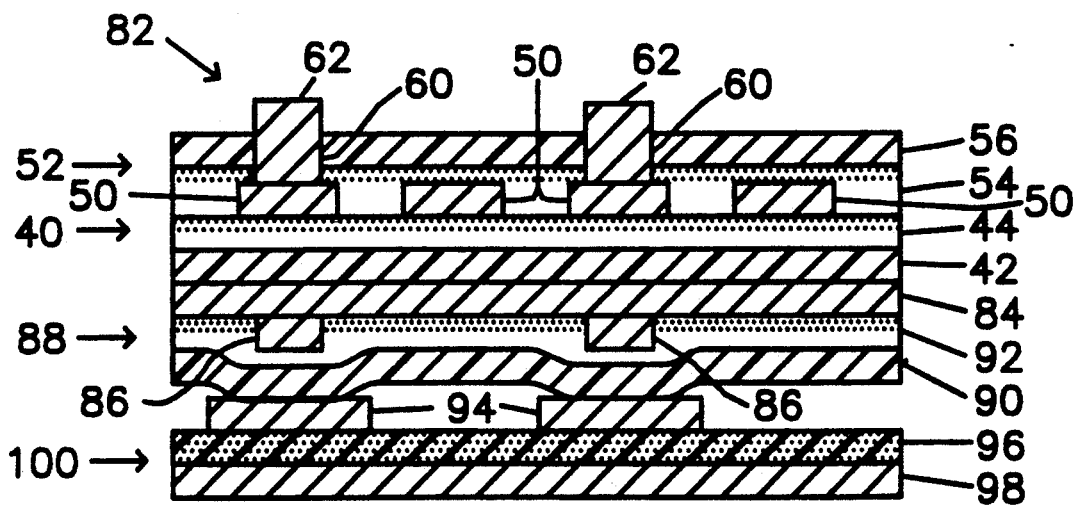

FIG. 9 illustrates another electrical connector assembly 82 embodying the present invention, including a metallized coverlay 84 formed on the back side 40b of the sheet 40. Dots 86 are plated or otherwise formed on the coverlay 84. Another coverlay 88 including a polyimide layer 90 and adhesive layer 92 may be formed over the coverlay 84 and dots 86.

Although the areas of the coverlay 88 over the dots 86 are subject to plastic deformation, the arrangement of FIG. 9 protects the dots 86 from abrasion and accomplishes the goal of locally increasing the thickness of the cable in the areas of the dots 62. The detrimental effect of the intervening layers 90 and 92 may be reduced by providing rigid pads 94 on the surface of a resilient pad 96 attached to a rigid back 98 of a pressure plate 100 which presses the assembly 82 into contact with a mating connector (not shown). The pads 94 are aligned with the dots 86, and serve to locally increase the applied pressure in the areas of the dots 86 to compensate for creep of the coverlay 88.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. An electrical connector assembly, comprising:
a flexible sheet having first and second sides;
a plurality of electrically conductive traces formed over the first side of the sheet, the traces having first sides which face the sheet and second sides which face away from the sheet;
a plurality of electrically conductive dots formed on the second sides of the traces in electrical connection therewith respectively;
a plurality of substantially rigid dots which are carried by the sheet over the first sides of the traces in alignment with the conductive dots respectively; and
a coverlay formed on the first side of the sheet over the traces, the conductive dots extending through the coverlay from the second sides of the trace beyond the surface of the coverlay.

2. An assembly as in claim 1, in which the rigid dots are formed of metal.

3. An assembly as in claim 1, in which the rigid dots extend through the sheet from the first sides of the traces to the second side of the sheet.

4. An assembly as in claim 1, in which the rigid dots extend through the sheet from the first sides of the traces beyond the second side of the sheet.

5. An electrical connector assembly, comprising:
a flexible sheet having first and second sides;
a plurality of electrically conductive traces formed over the first side of the sheet, the traces having first sides which face the sheet and second sides which face away from the sheet;
a plurality of electrically conductive dots formed on the second sides of the traces in electrical connection therewith respectively;
a plurality of substantially rigid dots which are carried by the sheet over the first sides of the traces in alignment with the conductive dots respectively; and
an electrically conductive layer formed over the second side of the sheet, the rigid dots being formed over the conductive layer.

6. An assembly as in claim 5, further comprising a coverlay formed over the conductive layer and rigid dots.

7. An assembly as in claim 5, further comprising a coverlay formed over the conductive layer, the rigid dots extending through the coverlay from the conductive layer to the surface of the coverlay.

8. An assembly as in claim 5, further comprising a coverlay formed over the conductive layer, the rigid dots extending through the coverlay from the conductive layer beyond the surface of the coverlay.

9. An electrical connector assembly, comprising:
a flexible sheet having first and second sides;
a plurality of electrically conductive traces formed over the first side of the sheet, the traces having first sides which face the sheet and second sides which face away from the sheet;
a plurality of electrically conductive dots formed on the second sides of the traces in electrical connection therewith respectively, and; a plurality of substantially rigid dots which are carried by the sheet over the first sides of the traces in alignment with the conductive dots respectively, the rigid dots being formed on the surface of the second side of the sheet.

10. A method of fabricating an electrical connector assembly, comprising the steps of:
(a) providing a flexible sheet having first and second sides;
(b) forming a plurality of electrically conductive traces over the first side of the sheet, the traces having first sides which face the sheet and second sides which face away from the sheet;
(c) forming a plurality of electrically conductive dots over the second sides of the traces in electrical connection therewith respectively;

(d) forming a plurality of substantially rigid dots which are carried by the sheet over the first sides of the traces in alignment with the conductive dots respectively; and in which step (c) comprises the substeps of:

(e) forming a coverlay over the first side of the sheet and the traces; and (f) forming the conductive dots through the coverlay so as to extend from the second sides of the traces beyond the surface of the coverlay.

11. A method as in claim 10, in which step (d) comprises forming the rigid dots of metal.

12. A method as in claim 10, in which step (d) comprises forming the rigid dots through the sheet from the first side of the traces to the second side of the sheet.

13. A method as in claim 10, in which step (d) comprises forming the rigid dots through the sheet from the first sides of the traces beyond the surface of the second side of the sheet.

14. A method of fabricating an electrical connector assembly, comprising the steps of:

(a) providing a flexible sheet having first and second sides:

(b) forming a plurality of electrically conductive traces over the first side of the sheet, the traces having first sides which face the sheet and second sides which face away from the sheet;

(c) forming a plurality of electrically conductive dots over the second sides of the traces in electrical connection therewith respectively;

(d) forming a plurality of substantially rigid dots which are carried by the sheet over the first sides of the traces in alignment with the conductive dots respectively; and further comprising the step, performed between steps (a) and (d), of:

(e) forming an electrically conductive layer over the second side of the sheet; step (d) including forming the rigid dots over the conductive layer.

15. A method as in claim 14, further comprising the step, performed after step (d), of:

(f) forming a coverlay over the conductive layer and rigid dots.

16. A method as in claim 14, further comprising the step, performed between steps (e) and (d), of:

(f) forming a coverlay over the conductive layer;

step (d) including forming the rigid dots through the coverlay so as to extend from the first sides of the traces to the surface of the coverlay.

17. A method as in claim 14, further comprising the step, performed between steps (e) and (d), of:

(f) forming a coverlay over the conductive layer;

step (d) including forming the rigid dots through the coverlay so as to extend from the first sides of the traces beyond the surface of the coverlay.

18. A method of fabricating an electrical connector assembly, comprising the steps of:

(a) providing a flexible sheet having first and second sides;

(b) forming a plurality of electrically conductive traces over the first side of the sheet, the traces having first sides which face the sheet and second sides which face away from the sheet;

(c) forming a plurality of electrically conductive dots over the second sides of the traces in electrical connection therewith respectively; and (d) forming a plurality of substantially rigid dots which are carried by the sheet over the first sides of the traces in alignment with the conductive dots respectively;

in which step (d) comprises forming the rigid dots on the surface of the second side of the sheet.

19. A method as in claim 18, in which step (d) comprises the substeps of:

(e) forming a sacrificial layer of material over the second side of the sheet;

(f) forming holes through the sacrificial layer and the sheet to the first sides of the traces in alignment with the conductive dots respectively;

(g) forming the rigid dots in the holes; and (h) removing the sacrificial layer.

20. A method as in claim 18, in which step (d) comprises the substeps of:

(e) forming holes through the sheet from the second side thereof to the first sides of the traces in alignment with the conductive dots respectively; and (f) forming the rigid dots in the holes.

21. A method as in claim 20, in which step (f) comprises forming the rigid dots in the holes by plating.

22. A method as in claim 18, in which:

step (c) includes the substeps of:

(e) forming a coverlay over the first side of the sheet and the traces;

(f) forming a sacrificial layer of material over the coverlay;

(g) forming first holes through the sacrificial layer and the coverlay to the second sides of the traces in alignment with positions for the conductive dots respectively;

(h) forming the conductive dots in the first holes; and (i) removing the sacrificial layer;

step (d) includes the substeps of:

(j) forming second holes through the sheet from the second side thereof to the first sides of the traces in alignment with positions for the rigid dots respectively; and (k) forming the rigid dots in the second holes;

steps (h) and (k) being performed simultaneously.

23. A method as in claim 22, in which step (j) is performed before step (b).

24. A method as in claim 22, in which step (j) is performed after step (b).

25. A method as in claim 22, in which steps (h) and (k) includes forming the conductive dots and rigid dots by metal plating.

26. A method as in claim 22, in which:

step (d) further includes the substep, performed between steps (a) and (j), of:

(l) forming a second sacrificial layer over the second side of the sheet;

step (j) further includes forming the second holes through the second sacrificial layer; and step (d) further includes the substep, performed after step (k), of:

(m) removing the second sacrificial layer.

* * * * *